(12) United States Patent
Kim et al.

(10) Patent No.: US 12,237,359 B2
(45) Date of Patent: Feb. 25, 2025

(54) DISPLAY APPARATUS USING SEMICONDUCTOR LIGHT-EMITTING DEVICE

(71) Applicant: LG ELECTRONICS INC., Seoul (KR)

(72) Inventors: Jungsub Kim, Seoul (KR); Younghak Chang, Seoul (KR); Myoungsoo Kim, Seoul (KR); Yeonhong Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 958 days.

(21) Appl. No.: 17/257,190

(22) PCT Filed: Jul. 11, 2018

(86) PCT No.: PCT/KR2018/007833
§ 371 (c)(1),
(2) Date: Dec. 30, 2020

(87) PCT Pub. No.: WO2020/009262
PCT Pub. Date: Jan. 9, 2020

(65) Prior Publication Data
US 2021/0159269 A1 May 27, 2021

(30) Foreign Application Priority Data
Jul. 4, 2018 (KR) .......................... 10-2018-0077924

(51) Int. Cl.
*H01L 27/15* (2006.01)
*H01L 33/02* (2010.01)
(Continued)

(52) U.S. Cl.
CPC .......... *H01L 27/156* (2013.01); *H01L 33/025* (2013.01); *H01L 33/20* (2013.01); *H01L 33/382* (2013.01)

(58) Field of Classification Search
CPC ..... H01L 33/00–648; H01L 27/15–156; H01L 2933/00–0091;
(Continued)

(56) References Cited

U.S. PATENT DOCUMENTS 5,260,589 A * 11/1993 Yamauchi ............... H01L 33/10
257/E33.068
2006/0186426 A1   8/2006 Nunque et al.
(Continued)

FOREIGN PATENT DOCUMENTS

CN        100373642 C    3/2008
JP        2008-108981 A  5/2008
(Continued)

*Primary Examiner* — Julio J Maldonado
*Assistant Examiner* — Stanetta D Isaac
(74) *Attorney, Agent, or Firm* — Birch, Stewart, Kolasch & Birch, LLP

(57) ABSTRACT

Discussed is a plurality of semiconductor light-emitting devices, wherein at least one of the semiconductor light-emitting devices includes: a first conductive electrode and a second conductive electrode; a first conductive semiconductor layer having the first conductive electrode arranged thereon; a second conductive semiconductor layer overlapping the first conductive semiconductor layer and having the second conductive electrode arranged thereon; an active layer arranged between the first conductive semiconductor layer and the second conductive semiconductor layer; an intermediate layer arranged on the second conductive semiconductor layer; a protrusion, made of an electro-polishable porous material, on the intermediate layer; and an undoped semiconductor layer arranged between the intermediate layer and the protrusion. The intermediate layer includes a
(Continued)

first layer including second conductive impurities and a second layer having a higher concentration of the second conductive impurities than the first layer, wherein the first layer and the second layer are sequentially and repetitively stacked.

18 Claims, 16 Drawing Sheets

(51) Int. Cl.
*H01L 33/20* (2010.01)
*H01L 33/38* (2010.01)

(58) Field of Classification Search
CPC ......... H01L 25/075–0756; H01L 25/13; H01L 25/16–167; H01L 25/18; H10K 59/90–95
See application file for complete search history.

(56) References Cited

U.S. PATENT DOCUMENTS

| | | |
|---|---|---|
| 2012/0187444 A1 | 7/2012 | Oh et al. |
| 2013/0248911 A1 | 9/2013 | Hwang et al. |
| 2019/0081025 A1* | 3/2019 | Chang ................... H01L 33/025 |

FOREIGN PATENT DOCUMENTS

| | | |
|---|---|---|
| KR | 10-2006-0069375 A | 6/2008 |
| KR | 10-2008-0098812 A | 11/2008 |
| KR | 10-1001782 B1 | 12/2010 |
| KR | 10-2011-0101712 A | 9/2011 |
| KR | 10-2011-0107818 A | 10/2011 |
| KR | 10-2012-0075070 A | 7/2012 |
| KR | 10-2013-0107541 A | 10/2013 |

* cited by examiner

DISPLAY APPARATUS USING SEMICONDUCTOR LIGHT-EMITTING DEVICE

CROSS REFERENCE TO RELATED APPLICATIONS

This application is the National Stage filing under 35 U.S.C. 371 of International Application No. PCT/KR2018/007833, filed on Jul. 11, 2018, which claims the benefit of earlier filing date and right of priority to Korean Patent Application No. 10-2018-0077924, filed on Jul. 4, 2018, the entire contents of all these applications are incorporated by reference into the present application.

BACKGROUND

1. Technical Field

The present disclosure relates to a display apparatus and a manufacturing method thereof, and more particularly, to a flexible display apparatus using a semiconductor light-emitting device.

2. Description of the Related Art

In recent years, display apparatuses having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting devices may be used to implement a display, thereby presenting a scheme for solving the problems.

As described above, in the case of a display using semiconductor light-emitting devices, there is a need to improve light extraction efficiency, and improve the leakage current of the semiconductor light-emitting devices so as to enhance the performance of the display apparatus.

Accordingly, in the present disclosure, a display apparatus structure with an enhanced light extraction efficiency of the display apparatus and an improved leakage current of the semiconductor light-emitting devices is proposed.

SUMMARY

An aspect of the present disclosure is to provide a display apparatus capable of preventing a semiconductor light-emitting device from being damaged due to heat or chemicals, and reducing manufacturing cost during a process of separating the semiconductor light-emitting device from a growth substrate.

Another aspect of the present disclosure is to provide a display apparatus having a semiconductor light-emitting device with enhanced light extraction efficiency.

Still another aspect of the present disclosure is to provide a display apparatus having a semiconductor light-emitting device with a reduced surface leakage current.

A display apparatus according to the present disclosure may include a plurality of semiconductor light-emitting devices, and at least one of the semiconductor light-emitting devices may include a first conductive electrode and a second conductive electrode; a first conductive semiconductor layer on which the first conductive electrode is disposed; a second conductive semiconductor layer configured to overlap with the first conductive semiconductor layer, on which the second conductive electrode is disposed; an active layer disposed between the first conductive semiconductor layer and the second conductive semiconductor layer; an intermediate layer disposed on the second conductive semiconductor layer; a protrusion formed of a porous material capable of electro polishing on the intermediate layer; and an undoped semiconductor layer disposed between the intermediate layer and the protrusion. Moreover, the intermediate layer may include a first layer containing second conductive impurities; and a second layer having a higher concentration of second conductive impurities than the first layer, wherein the first layer and the second layer are sequentially repeated and stacked.

In an embodiment, the first layer may be formed to have a thickness equal to or greater than that of the second layer.

In an embodiment, a thickness of the second layer may be within ±20% of an error range based on an integer multiple of ½ of a wavelength of light emitted from the semiconductor light-emitting device.

In an embodiment, the first layer may be stacked on the second layer to protrude laterally by a predetermined length.

In an embodiment, the predetermined length may be within an error range of ±20% based on an integer multiple of ½ of a wavelength of light emitted from the semiconductor light-emitting device.

In an embodiment, a porosity of the first layer may be smaller than that of the second layer.

In an embodiment, the protrusion may be formed of a second conductive semiconductor, and may have a higher impurity concentration than the first layer.

In an embodiment, the semiconductor light-emitting device may further include a third layer between the intermediate layer and the undoped semiconductor layer, wherein the third layer contains second conductive impurities, and has a lower impurity concentration than the first layer.

In an embodiment, the semiconductor light-emitting device may include a passivation layer surrounding a side surface of the first conductive semiconductor layer, the second conductive semiconductor layer, and the active layer.

In an embodiment, the passivation layer may be formed to extend to surround at least part of a side surface of the intermediate layer.

In a display apparatus according to the present disclosure, a layer of a porous material capable of being electro-polished may be disposed and separated by a mechanical lift-off method when the semiconductor light-emitting device is separated from the growth substrate, thereby prevent the semiconductor light-emitting device from being damaged due to heat or chemicals. Furthermore, process cost may be reduced, thereby providing a display apparatus with reduced manufacturing cost.

In addition, reflection from a side surface of the semiconductor light-emitting device may be reduced by an intermediate layer including second conductive impurities, and formed with a first layer and a second layer. Accordingly, a ratio of light emitted to the side surface of the semiconductor light-emitting device may be increased to improve the light extraction effect.

Moreover, the second layer of the intermediate layer is formed to have a higher porosity than that of the first layer, and thus has a high resistance. Accordingly, the semiconductor light-emitting device of the present disclosure may include a high resistance layer to reduce current leaked to a surface of the semiconductor light-emitting device, thereby increasing the luminous efficiency of the semiconductor light-emitting device.

DETAILED DESCRIPTION OF THE EMBODIMENTS

Figure 1:
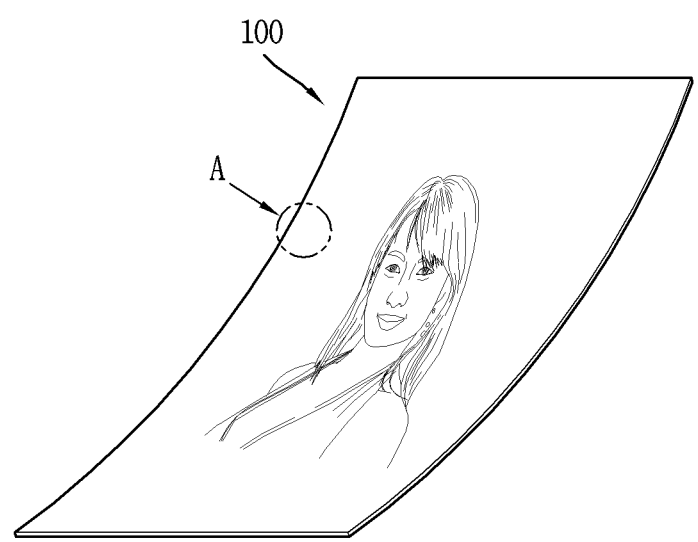
FIG. 1 is a conceptual view showing a display apparatus using a semiconductor light-emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display apparatus disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display apparatus using a semiconductor light-emitting device according to an embodiment of the present disclosure.

According to the drawing, information processed in the controller of the display apparatus 100 may be displayed using a flexible display.

The flexible display may include a flexible, bendable, twistable, foldable and rollable display. For example, the flexible display may be a display manufactured on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light-emitting device. According to the present disclosure, a light emitting diode (LED) is illustrated as a type of semiconductor light-emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
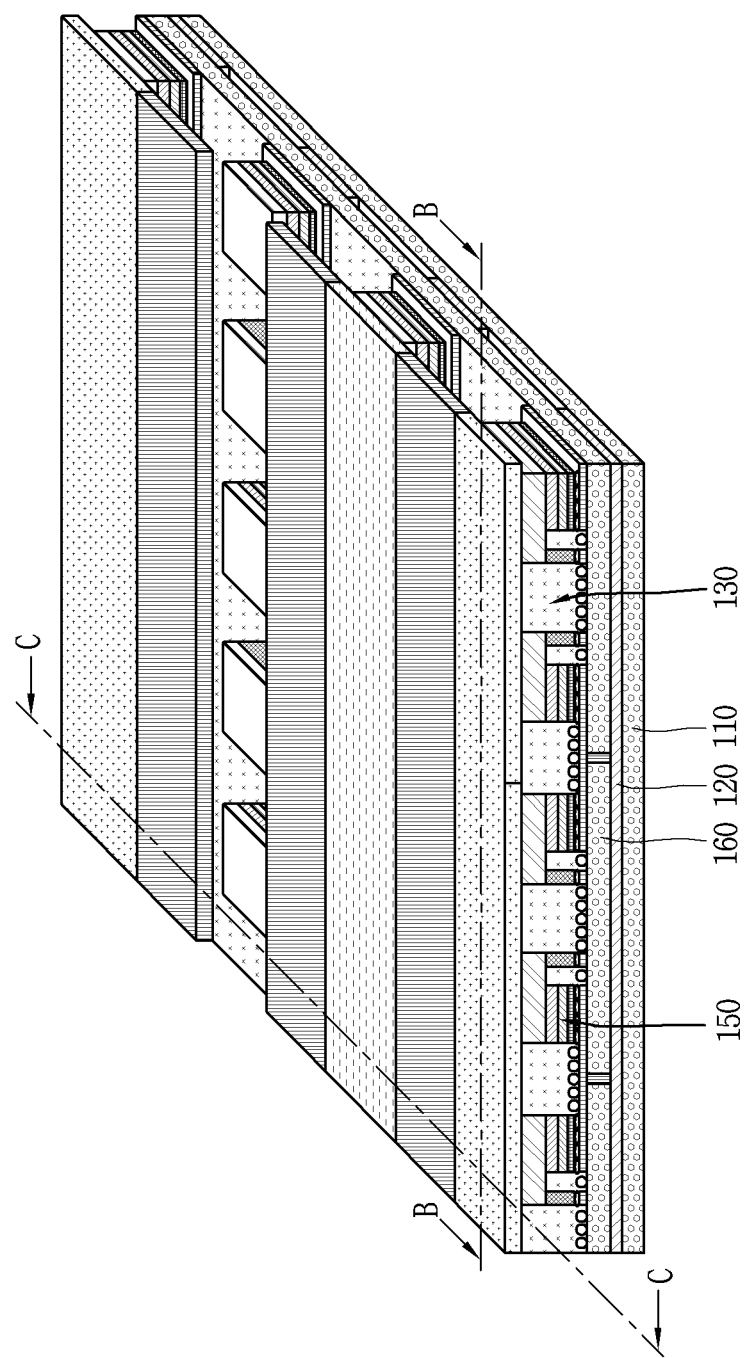
FIG. 2 is a partial enlarged view of portion "A" in FIG. 1, and FIGS. 3A and 3B are cross-sectional views taken along lines B-B and C-C in FIG. 2.
Figure 3A:
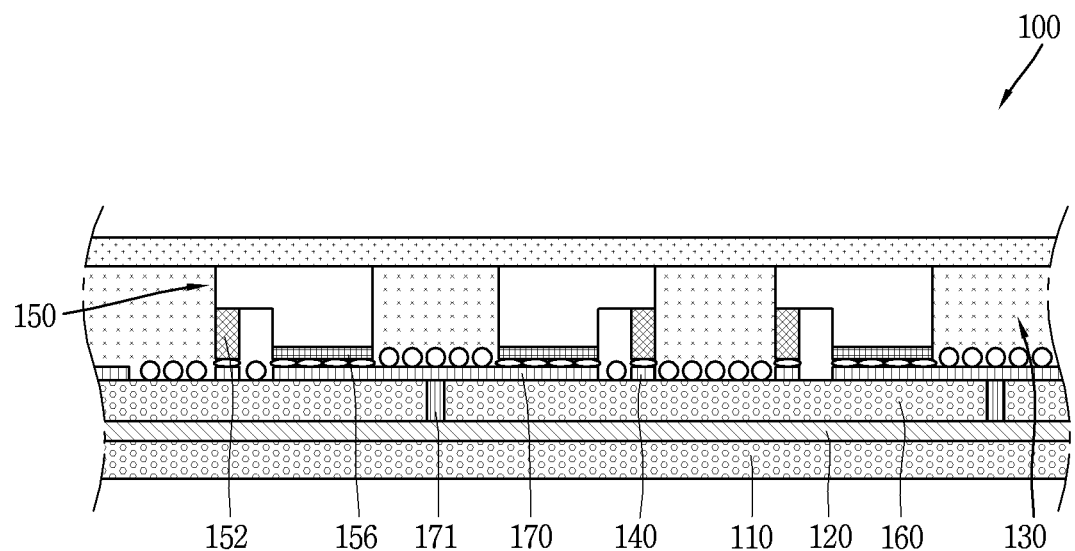
Figure 3B:
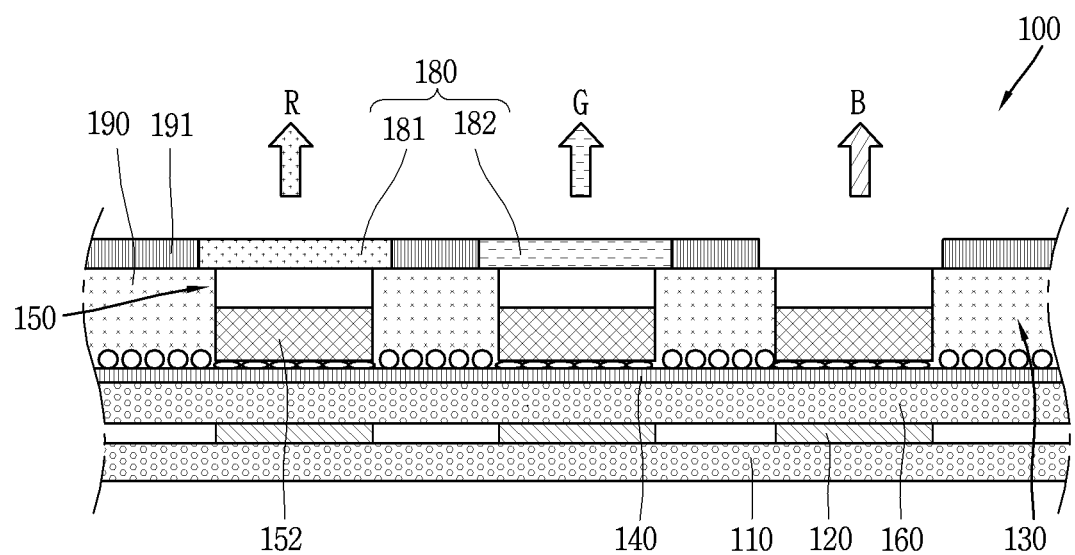
Figure 4:
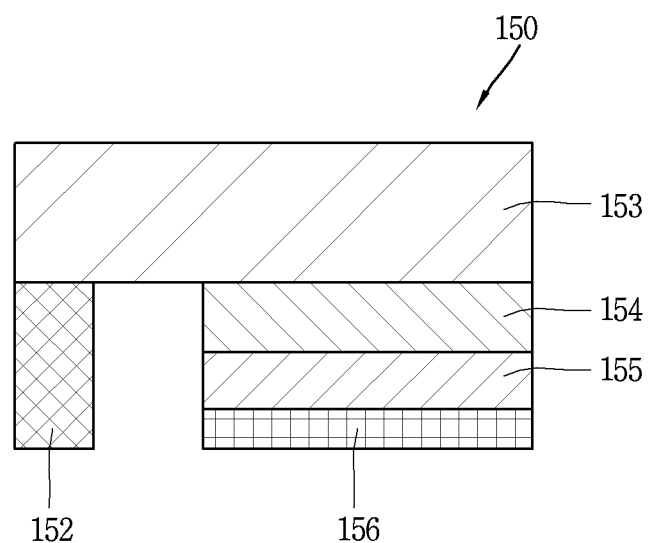
FIG. 4 is a conceptual view illustrating a flip-chip type semiconductor light-emitting device in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting device in FIG. 3A, and FIGS. 5A through 5C are conceptual views illustrating various forms for implementing colors in connection with a flip-chip type semiconductor light-emitting device.

According to the drawings in FIGS. 2, 3A and 3B, there is illustrated a display apparatus 100 using a passive matrix (PM) type semiconductor light-emitting device as a display apparatus 100 using a semiconductor light-emitting device. However, an example described below may also be applicable to an active matrix (AM) type semiconductor light-emitting device.

The display apparatus 100 may include a substrate 110, a first electrode 120, a conductive adhesive layer 130, a second electrode 140, and a plurality of semiconductor light-emitting devices 150.

The substrate 110 may be a flexible substrate. The substrate 110 may contain glass or polyimide (PI) to implement the flexible display apparatus. In addition, if it is an insulating and flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form a single wiring substrate.

The auxiliary electrode 170 as an electrode for electrically connecting the first electrode 120 to the semiconductor light-emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display apparatus.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light-emitting device 150 is connect thereto in a flip chip form with the application of heat and pressure, the semiconductor light-emitting device 150 is electrically connected to the first electrode 120 and second electrode 140.

Referring to FIG. 4, the semiconductor light-emitting device may be a flip chip type semiconductor light-emitting device.

For example, the semiconductor light-emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting devices 150. For example, the left and right p-type electrodes of the semiconductor light-emitting devices around the auxiliary electrode may be electrically connected to one auxiliary electrode.

More specifically, the semiconductor light-emitting device 150 is pressed into the conductive adhesive layer 130, and through this, only a portion between the p-type electrode 156 and auxiliary electrode 170 of the semiconductor light-emitting device 150 and a portion between the n-type electrode 152 and second electrode 140 of the semiconductor light-emitting device 150 have conductivity, and the remaining portion does not have conductivity since there is no push-down of the semiconductor light-emitting device. As described above, the conductive adhesive layer 130 may form an electrical connection as well as allow a mutual coupling between the semiconductor light-emitting device 150 and the auxiliary electrode 170 and between the semiconductor light-emitting device 150 and the second electrode 140.

Furthermore, a plurality of semiconductor light-emitting devices 150 constitute a light-emitting array, and a phosphor layer 180 is formed on the light-emitting array.

The light emitting device array may include a plurality of semiconductor light-emitting devices with different self luminance values. Each of the semiconductor light-emitting devices 150 constitutes a sub-pixel, and is electrically connected to the first electrode 120. For example, there may exist a plurality of first electrodes 120, and the semiconductor light-emitting devices are arranged in several rows, for instance, and each row of the semiconductor light-emitting devices may be electrically connected to any one of the plurality of first electrodes.

Furthermore, the semiconductor light-emitting devices may be connected in a flip chip form, and thus semiconductor light-emitting devices grown on a transparent dielectric substrate. Furthermore, the semiconductor light-emitting devices may be nitride semiconductor light-emitting devices, for instance. The semiconductor light-emitting device 150 has an excellent luminance characteristic, and thus it may be possible to configure individual sub-pixels even with a small size thereof.

According to the drawing, a partition wall 190 may be formed between the semiconductor light-emitting devices 150. The semiconductor light-emitting device 150 may have excellent luminance characteristics, and thus it may be possible to configure individual sub-pixels even with a small size thereof. For example, a base member of the anisotropic conductive film may form the partition wall when the semiconductor light-emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display apparatus. When a partition wall of a white insulator is used, an effect of enhancing reflectivity may be obtained. When a partition wall of a black insulator is used, a contrast ratio may be increased while having a reflection characteristic.

The phosphor layer 180 may be located at an outer surface of the semiconductor light-emitting device 150. For example, the semiconductor light-emitting device 150 is a blue semiconductor light-emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting device 151 at a location implementing a red sub-pixel, and a green phosphor 182 capable of converting blue light into green (G) light may be deposited on the blue semiconductor light-emitting device 151 at a location implementing a green sub-pixel. Furthermore, only the blue semiconductor light-emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light-emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
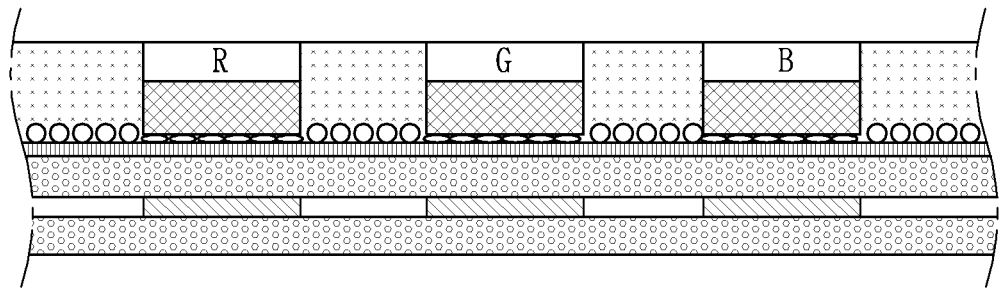
FIGS. 5A through 5C are conceptual views illustrating various forms for implementing colors in connection with a flip-chip type semiconductor light-emitting device.

Referring to FIG. 5A, each of the semiconductor light-emitting devices 150 may be implemented with a high-power light emitting device that emits various lights including blue in which gallium nitride (GaN) is mostly used, and indium (In) and or aluminum (Al) are added thereto.

In this case, the semiconductor light-emitting device 150 may be red, green and blue semiconductor light-emitting devices, respectively, to implement each sub-pixel. For instance, red, green and blue semiconductor light-emitting devices (R, G, B) are alternately disposed, and red, green and blue sub-pixels implement one pixel by means of the red, green and blue semiconductor light-emitting devices, thereby implementing a full color display.

Figure 5B:
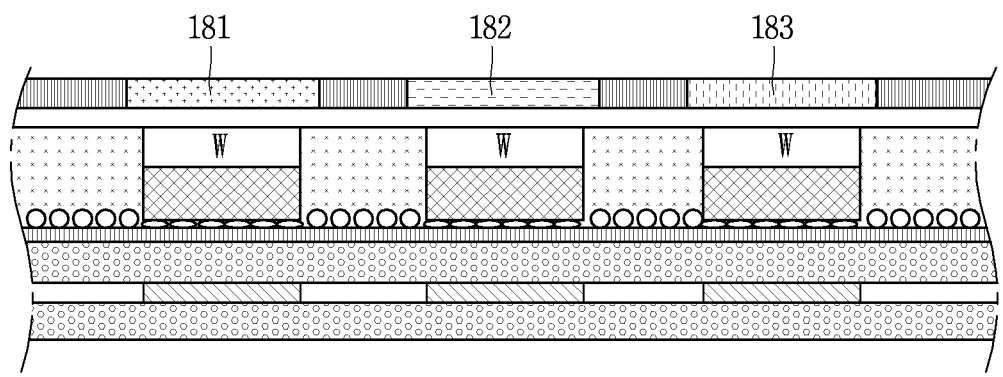

Referring to FIG. 5B, the semiconductor light-emitting device may have a white light emitting device (W) provided with a yellow phosphor layer for each device. In this case, a red phosphor layer 181, a green phosphor layer 182 and a blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
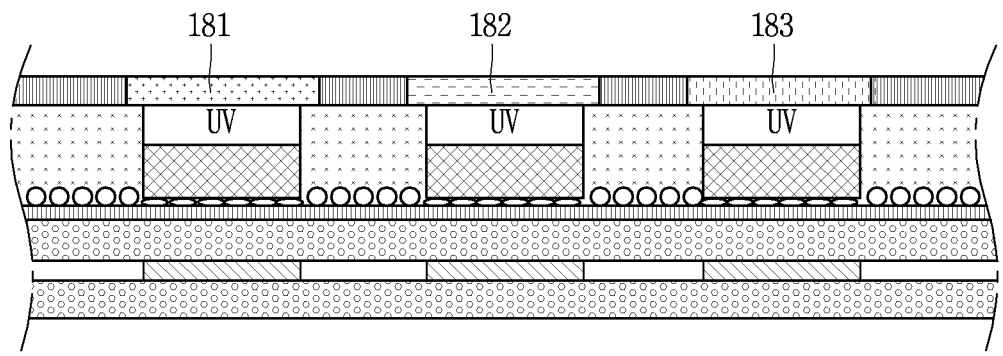

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light-emitting device can be used over the entire region up to ultra violet (UV) as well as visible light, and may be extended to a form of semiconductor light-emitting device in which ultra violet (UV) can be used as an excitation source.

Taking the present example into consideration again, the semiconductor light-emitting device 150 is placed on the conductive adhesive layer 130 to configure a sub-pixel in the display apparatus. The semiconductor light-emitting device 150 has an excellent luminance characteristic, and thus it may be possible to configure individual sub-pixels even with a small size thereof. The size of the individual semiconductor light-emitting device 150 may be less than 80 μm in the length of one side thereof, and formed with a rectangular or square shaped device. In case of a rectangular shaped device, the size thereof may be less than 20×80 μm.

Furthermore, even when a square shaped semiconductor light-emitting device 150 with a length of side of 10 μm is used for a sub-pixel, it will exhibit a sufficient brightness for implementing a display apparatus. Accordingly, for example, in case of a rectangular pixel in which one side of a sub-pixel is 600 μm in size, and the remaining one side thereof is 300 μm, a relative distance between the semiconductor light-emitting devices becomes sufficiently large. Accordingly, in this case, it may be possible to implement a flexible display apparatus having a HD image quality.

A display apparatus using the foregoing semiconductor light-emitting device will be manufactured by a new type of manufacturing method. Hereinafter, the manufacturing method will be described with reference to FIG. 6.

Figure 6:
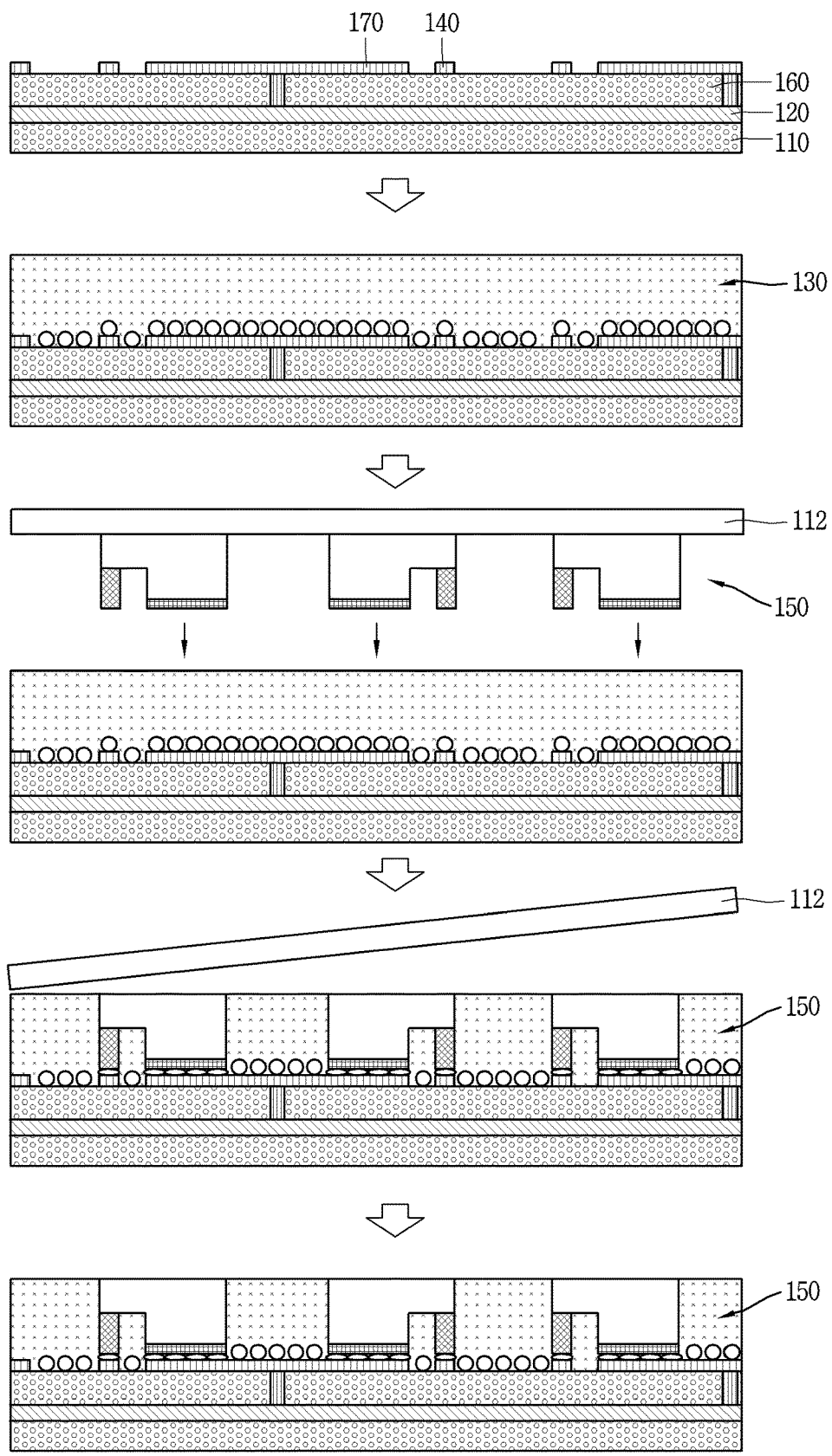
FIG. 6 is cross-sectional views illustrating a manufacturing method of a display apparatus using a semiconductor light-emitting device according to the present disclosure.

FIG. 6 is cross-sectional views illustrating a manufacturing method of a display apparatus using a semiconductor light-emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display apparatus.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light-emitting devices 150 corresponding to the location of the auxiliary electrodes 170 and second electrodes 140 and constituting individual pixels is disposed such that the semiconductor light-emitting device 150 faces the auxiliary electrode 170 and second electrode 140.

In this case, the second substrate 112 as a growth substrate for growing the semiconductor light-emitting device 150 may be a sapphire substrate or silicon substrate.

The semiconductor light-emitting device may have a gap and size capable of implementing a display apparatus when formed in the unit of wafer, and thus effectively used for a display apparatus.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting device 150 and the auxiliary electrode 170 and second electrode 140 may have conductivity due to the characteristics of an anisotropic conductive film having conductivity by thermal compression, thereby allowing the electrodes and semiconductor light-emitting device 150 to be electrically connected to each other. At this time, the semiconductor light-emitting device 150 may be inserted into the anisotropic conductive film, thereby forming a partition wall between the semiconductor light-emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting devices 150 to the outside. Silicon oxide (SiOx) or the like may be coated on the wiring substrate coupled to the semiconductor light-emitting device 150 to form a transparent insulating layer (not shown).

Furthermore, it may further include the process of forming a phosphor layer on one surface of the semiconductor light-emitting device 150. For example, the semiconductor light-emitting device 150 may be a blue semiconductor light-emitting device for emitting blue (B) light, and red or green phosphor for converting the blue (B) light into the color of the sub-pixel may form a layer on one surface of the blue semiconductor light-emitting device.

The manufacturing method or structure of a display apparatus using the foregoing semiconductor light-emitting device may be modified in various forms. For such an example, the foregoing display apparatus may be applicable to a vertical semiconductor light-emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
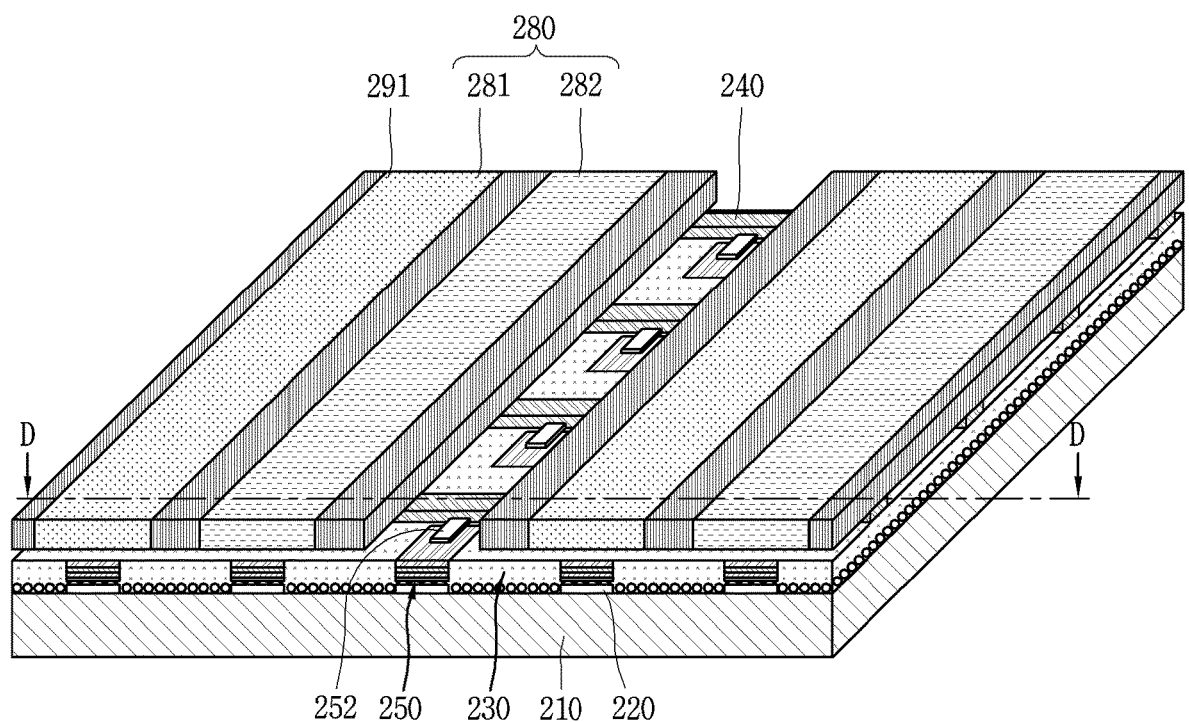
FIG. 7 is a perspective view showing a display apparatus using a semiconductor light-emitting device according to another embodiment of the present disclosure.
Figure 8:
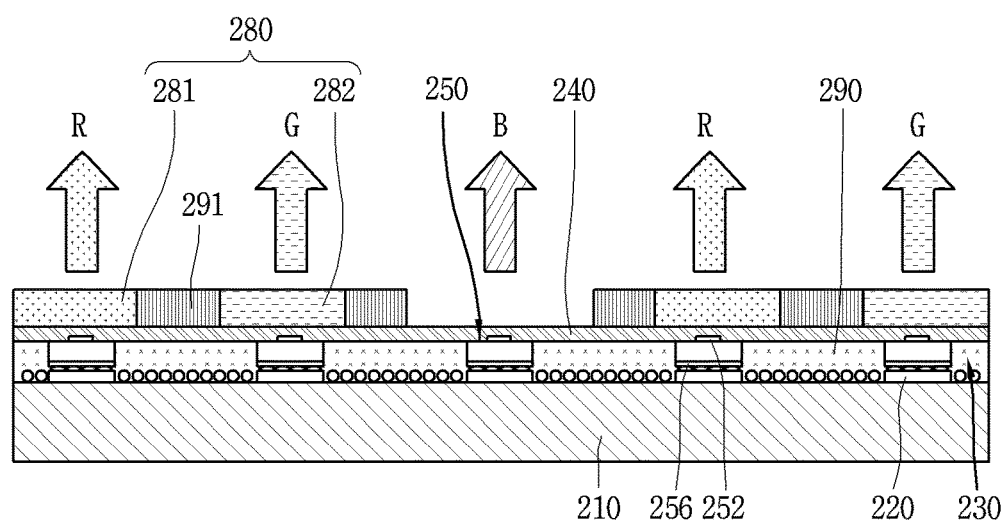
FIG. 8 is a cross-sectional view taken along line D-D in FIG. 7.
Figure 9:
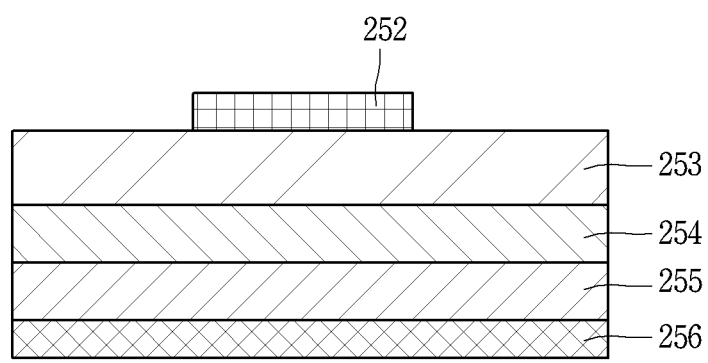
FIG. 9 is a conceptual view showing a vertical semiconductor light-emitting device in FIG. 8.

FIG. 7 is a perspective view illustrating a display apparatus using a semiconductor light-emitting device according to another embodiment of the present disclosure. FIG. 8 is a cross-sectional view taken along line C-C in FIG. 7, and FIG. 9 is a conceptual view illustrating a vertical type semiconductor light-emitting device in FIG. 8.

According to the drawings, the display apparatus may be display apparatus using a passive matrix (PM) type of vertical semiconductor light-emitting device.

The display apparatus may include a substrate 210, a first electrode 220, a conductive adhesive layer 230, a second electrode 240 and a plurality of semiconductor light-emitting devices 250.

The substrate 210 as a wiring substrate disposed with the first electrode 220 may include polyimide (PI) to implement a flexible display apparatus. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similarly to a display apparatus to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting device 250 thereto, the semiconductor light-emitting device 250 is electrically connected to the first electrode 220. At this time, the semiconductor light-emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting device 250 and the first electrode 220.

In this manner, the semiconductor light-emitting device 250 is placed on the conductive adhesive layer 230, thereby configuring a separate sub-pixel in the display apparatus. The semiconductor light-emitting device 250 has an excellent luminance characteristic, and thus it may be possible to configure individual sub-pixels even with a small size thereof. The size of the individual semiconductor light-emitting device 250 may be less than 80 μm in the length of one side thereof, and formed with a rectangular or square shaped device. In case of a rectangular shaped device, the size thereof may be less than 20×80 μm.

The semiconductor light-emitting device 250 may be a vertical structure.

A plurality of second electrodes 240 disposed in a direction of crossing the length direction of the first electrode 220, and electrically connected to the vertical semiconductor light-emitting device 250 may be located between vertical semiconductor light-emitting devices.

Referring to FIG. 9, the vertical semiconductor light-emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting device 250, thereby providing a great advantage capable of reducing the chip size.

Referring again to FIG. 8, a phosphor layer 280 may be formed on one surface of the semiconductor light-emitting device 250. For example, the semiconductor light-emitting device 250 is a blue semiconductor light-emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting device 251 at a location implementing a red sub-pixel, and a green phosphor 282 capable of converting blue light into green (G) light may be deposited on the blue semiconductor light-emitting device 251 at a location implementing a green sub-pixel. Furthermore, only the blue semiconductor light-emitting device 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display apparatus to which a flip chip type light emitting device is applied.

Taking the present embodiment into consideration again, the second electrode 240 is located between the semiconductor light-emitting devices 250, and electrically connected to the semiconductor light-emitting devices 250. For example, the semiconductor light-emitting devices 250 may be disposed in a plurality of rows, and the second electrode 240 may be located between the rows of the semiconductor light-emitting devices 250.

Since a distance between the semiconductor light-emitting devices 250 constituting individual pixels is sufficiently large, the second electrode 240 may be located between the semiconductor light-emitting devices 250.

The second electrode 240 may be formed with a bar-shaped electrode elongated in one direction, and disposed in a perpendicular direction to the first electrode.

Furthermore, the second electrode 240 may be electrically connected to the semiconductor light-emitting device 250 by a connecting electrode protruded from the second electrode 240. More specifically, the connecting electrode may be an n-type electrode of the semiconductor light-emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting device 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting device 250, the ITO material has a problem of bad adhesiveness with an n-type semiconductor. Accordingly, the second electrode 240 may be placed between the semiconductor light-emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light-emitting devices 250. In other words, the partition wall 290 may be disposed between the vertical semiconductor light-emitting devices 250 to isolate the semiconductor light-emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. The partition wall 290 may include a black or white insulator according to the purpose of the display apparatus.

If the second electrode 240 is precisely located on the conductive adhesive layer 230 between the semiconductor light-emitting devices 250, the partition wall 290 may be located between the semiconductor light-emitting device 250 and second electrode 240. Accordingly, individual sub-pixels may be configured even with a small size using the semiconductor light-emitting device 250, and a distance between the semiconductor light-emitting devices 250 may be relatively sufficiently large to place the second electrode 240 between the semiconductor light-emitting devices 250, thereby having the effect of implementing a flexible display apparatus having a HD image quality.

Furthermore, according to the drawing, a black matrix 291 may be disposed between each phosphor layer to enhance contrast. In other words, the black matrix 291 can enhance the contrast of luminance.

In this manner, the semiconductor light-emitting device 250 is placed on the conductive adhesive layer 230, thereby configuring a separate sub-pixel in the display apparatus. The semiconductor light-emitting device 250 has an excellent luminance characteristic, and thus it may be possible to configure individual sub-pixels even with a small size thereof. As a result, it may be possible to implement a full color display in which the sub-pixels of red (R), green (G) and blue (B) implement one pixel by means of the semiconductor light-emitting device.

In the display apparatus using the semiconductor light-emitting device of the present disclosure described above, a laser lift-off (LLO) method or a chemical lift-off (CLO) method may be used to separate the semiconductor light— Can be used for separation. When the semiconductor light-emitting device is separated using the laser lift-off method or the chemical lift-off method, damage to the semiconductor light-emitting device may be caused by heat or chemicals caused by the laser. In addition, there is a problem in that process cost is increased due to high facility cost, thereby increasing manufacturing cost. Accordingly, in the present disclosure, a display apparatus having a new structure capable of solving such a problem will be described.

In other words, according to the present disclosure, when the semiconductor light-emitting device is separated from the growth substrate, it may be possible to prevent the semiconductor light-emitting device from being damaged by heat or chemicals caused by laser, and reducing manufacturing cost.

Moreover, reflection from a side surface of the semiconductor light-emitting device may be reduced on an intermediate layer including second conductive impurities, and formed with a first layer and a second layer. Accordingly, a ratio of light emitted to the side surface of the semiconductor light-emitting device may be increased to improve the light extraction effect.

Furthermore, the second layer is formed to have a higher porosity than that off the first layer, and thus has a high resistance. Accordingly, the semiconductor light-emitting device of the present disclosure may be formed as a high resistance layer on an intermediate layer to reduce current leaked to a surface of the semiconductor light-emitting device, thereby increasing the luminous efficiency of the semiconductor light-emitting device.

Figure 10:
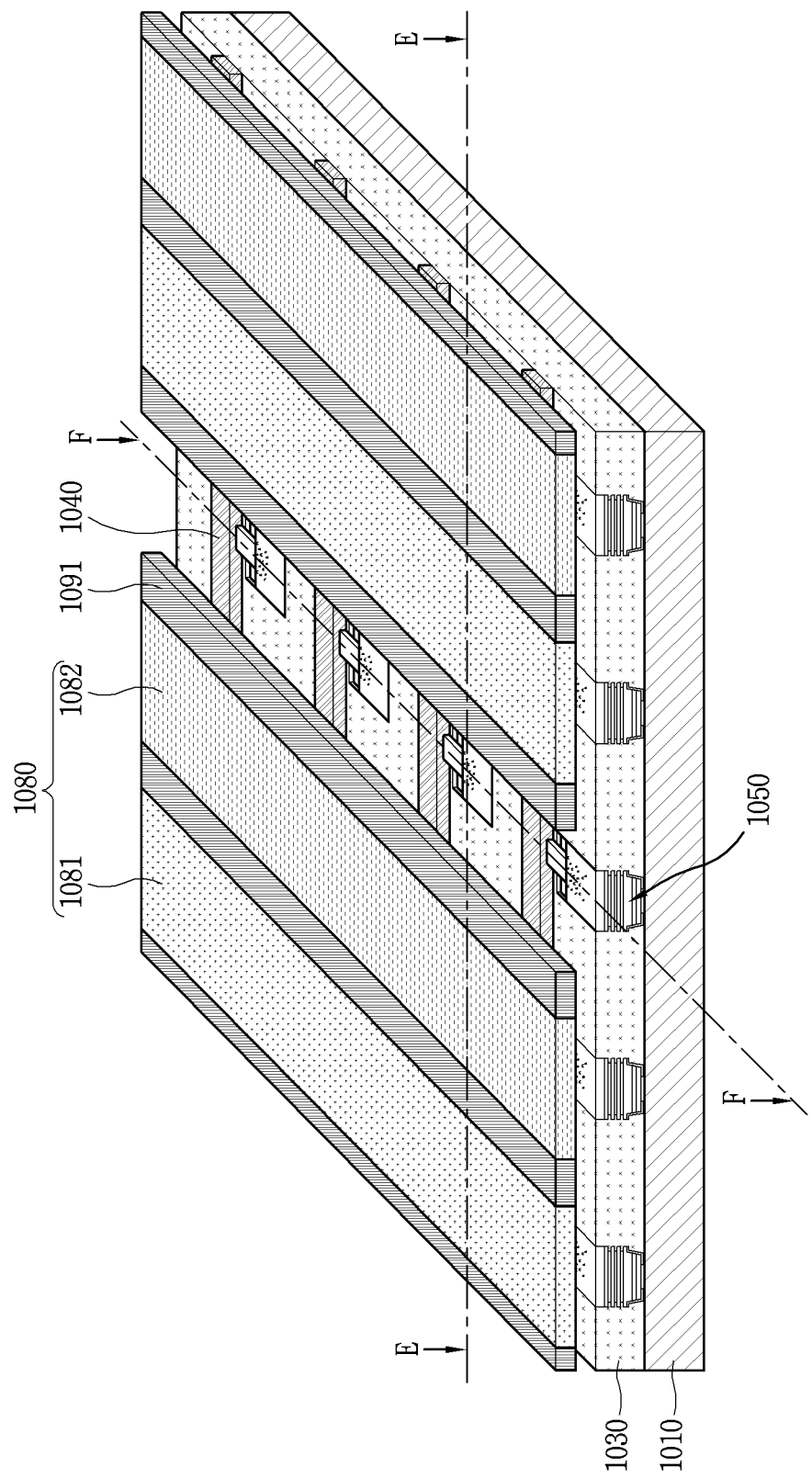
FIG. 10 is an enlarged view of portion "A" in FIG. 1 for explaining another embodiment of the present disclosure to which a display apparatus having a new structure is applied.
Figure 11:
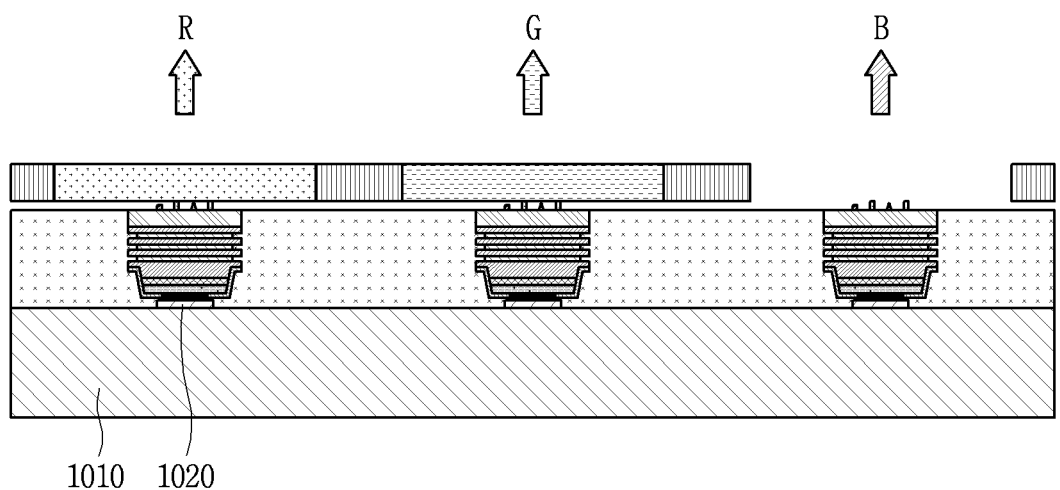
FIG. 11 is a cross-sectional view taken along line E-E in FIG. 10.

FIG. 10 is an enlarged view of portion "A" in FIG. 1 for explaining still another embodiment of the present disclosure of a display apparatus having a new structure. FIG. 11 is a cross-sectional view taken along line E-E in FIG. 10, and FIG. 12 is a cross-sectional view taken along line F-F of FIG. 10.

Figure 12:
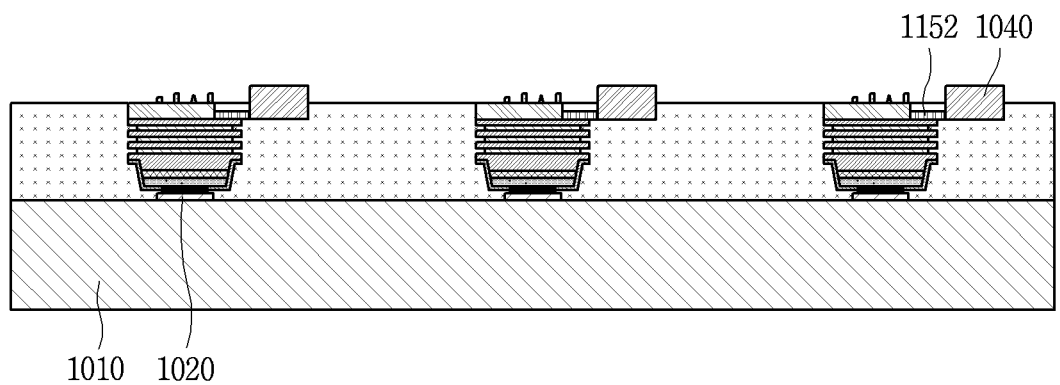
FIG. 12 is a cross-sectional view taken along line F-F in FIG. 10.

According to the drawings in FIGS. 10 through 12, as a display apparatus 1000 using a semiconductor light-emitting device, it may be also applicable to the display apparatus 1000 using a passive matrix (PM) type semiconductor light-emitting device or an active matrix (AM) type semiconductor light-emitting device.

The display apparatus 1000 may include a substrate 1010, a first electrode 1020, an insulating member 1030, a second electrode 1040, and a plurality of semiconductor light-emitting devices 1050. Here, the first electrode 1020 may be disposed on the substrate 1010 and formed as a line.

The substrate 1010 as a wiring substrate disposed with the first electrode 1020 may include polyimide (PI) to implement a flexible display apparatus. Furthermore, according to circumstances, the substrate 1010 may be formed of an insulating but non-flexible material. Furthermore, the substrate 1010 may be either one of transparent and non-transparent materials.

As illustrated, the insulating member 1030 may be formed to surround the semiconductor light-emitting devices 1050. In an embodiment, the insulating member 1030 may include polydimethylsiloxane (PDMS) or polymethylphenylsiloxane (PMPS) as a polymer material, and may include various insulating materials that surround the semiconductor light-emitting device 1050. The first conductive electrode 1156 and the second conductive electrode 1152 of the semiconductor light-emitting devices 1050 may be electrically coupled to the first electrode 1020 and the second electrode 1040, respectively, in a corresponding manner.

Moreover, the display apparatus 1000 may further include a phosphor layer 1080 formed on a surface of the plurality of semiconductor light-emitting devices 1050. For example, the semiconductor light-emitting device 1050 is a blue semiconductor light-emitting device that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels.

In other words, a red phosphor 1081 capable of converting blue light into red (R) light may be deposited on a blue semiconductor light-emitting device 1051a at a location implementing a red sub-pixel, and a green phosphor 1082 capable of converting blue light into green (G) light may be deposited on the blue semiconductor light-emitting device 1051b at a location implementing a green sub-pixel. Furthermore, only the blue semiconductor light-emitting device 1051c may be solely used at a location implementing a blue sub-pixel. In this case, the red (R), green (G) and blue (B) sub-pixels may implement one pixel. The semiconductor light-emitting device 1050 may be combined with a quantum dot (QD) instead of a phosphor to implement sub-pixels that emit red (R), green (G) and blue (B).

Furthermore, in order to improve the contrast of the phosphor layer 1080, the display apparatus may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection.

Figure 13A:
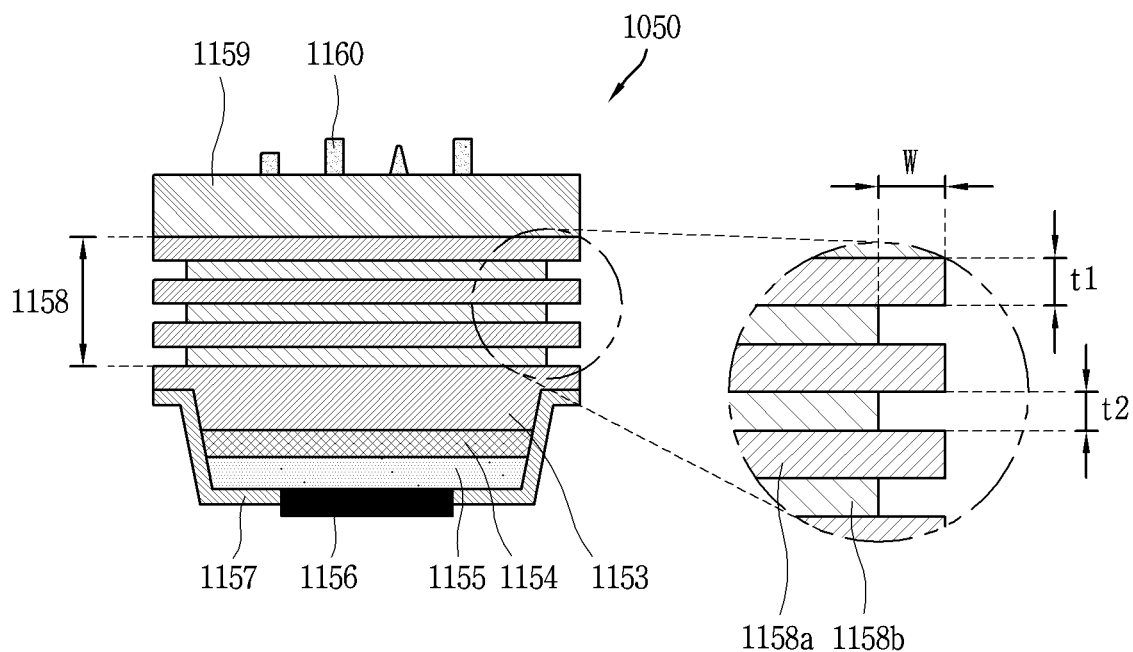
FIG. 13A is a conceptual view showing a vertical semiconductor light-emitting device in FIG. 11.
Figure 13B:
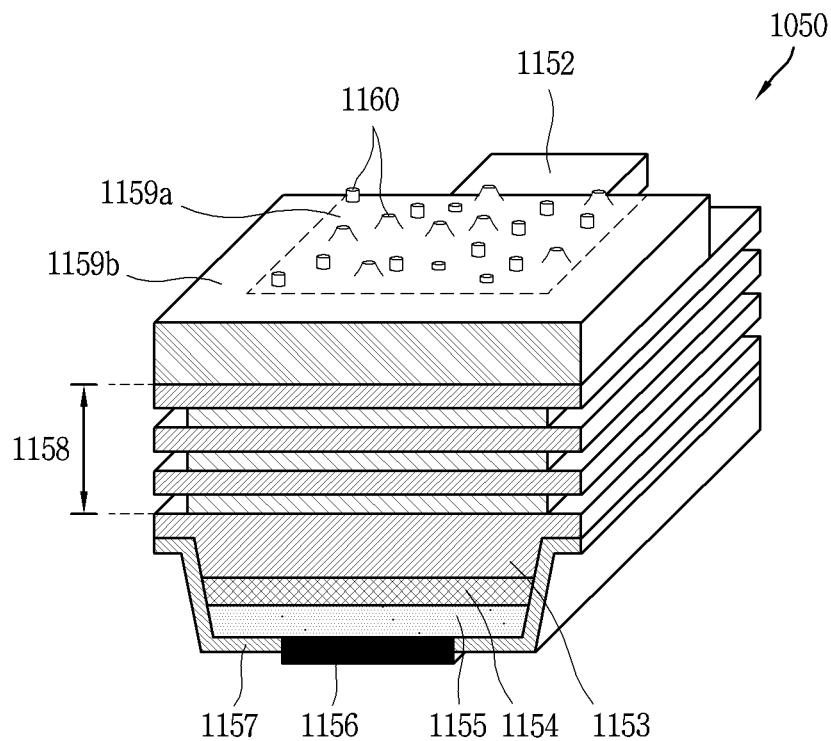
FIG. 13B is a conceptual view showing a vertical semiconductor light-emitting device in FIG. 11.

On the other hand, FIG. 13A is a conceptual view illustrating a flip-chip type semiconductor light-emitting device 1050 in FIG. 11, and FIG. 13B is a perspective view illustrating a flip-chip type semiconductor light-emitting device 1050 in FIG. 11.

Referring to FIGS. 13A and 13B, the display apparatus 1000 of the present disclosure may include a semiconductor light-emitting device 1050 including an intermediate layer 1158 to reduce reflection from a side surface of the semiconductor light-emitting device. Accordingly, a ratio of light emitted to the side surface of the semiconductor light-emitting device may be increased to improve the light extraction effect.

The semiconductor light-emitting device 1050 of the display apparatus 1000 includes a first conductive semiconductor layer 1155, an active layer 1154, a second conductive semiconductor layer 1153, a first conductive electrode 1156, and a second conductive electrode 1152, a passivation layer 1157, an intermediate layer 1158, an undoped semiconductor layer 1159, and a protrusion 1160.

The first conductive semiconductor layer 1155, the active layer 1154, and the second conductive semiconductor layer 1153 are overlapped and sequentially stacked, and the first conductive electrode 1156 may be formed on the first conductive semiconductor layer 1155. Furthermore, the intermediate layer 1158 may be disposed on the second conductive semiconductor layer 1153. Moreover, an undoped semiconductor layer 1159 may be disposed on the intermediate layer 1158. Furthermore, a protrusion 1160 formed of a porous material capable of electro polishing may be disposed on the undoped semiconductor layer 1159.

In an embodiment, the first conductive semiconductor layer 1155, the active layer 1154, the second conductive semiconductor layer 1153, the intermediate layer 1158, the undoped semiconductor layer 1159 and the protrusion 1160 may be formed of a semiconductor formed of gallium nitride (GaN). In detail, the first conductive semiconductor layer 1155 may be formed of p-GaN implanted with p-type impurities. Meanwhile, the second conductive semiconductor layer 1153, the intermediate layer 1158, and the protrusion 1160 may be formed of n-GaN implanted with n-type impurities. Moreover, the n-type impurities may be silicon (Si).

The intermediate layer 1158 may include a first layer 1158a and a second layer 1158b including second conductive impurities. Moreover, the intermediate layer 1158 may be formed as a layer in which the first layer 1158a and the second layer 1158b are sequentially repeated and stacked.

In detail, the first layer 1158a may be formed of a layer having the same constituent components and the same doping concentration as the second conductive semiconductor layer 1153. Specifically, the impurity concentration of the first layer 1158a may be above $10^{18}/cm^3$. Meanwhile, the second layer 1158b may have a higher concentration of second conductive impurities than the first layer 1158a.

A thickness (t1) of the first layer may be equal to or greater than a thickness (t2) of the second layer. In addition, the thickness t2 of the second layer may have a thickness that is an integer multiple of ½ of a wavelength of light emitted from the semiconductor light-emitting device 1050. In this case, the thickness of the second layer 1158b may be formed within ±20% of an error range based on an integer multiple of ½ of the wavelength of light emitted from the semiconductor light-emitting device 1050 in consideration of a light emission waveform full-width at half-maximum (about 5%) and a measurement error (about 10%) of light emitted from the semiconductor light-emitting device 1050.

In detail, when light emitted from the semiconductor light-emitting device 1050 is blue light, it has a wavelength of about 400 nm. In an embodiment, when the semiconductor light-emitting device 1050 emits blue light having a wavelength of 440 nm, a half wavelength of the emitted light may be 220 nm, which may be the thickness (t2) of the second layer. Moreover, the thickness (t2) of the second layer may be formed as an integer multiple of 220 nm, such as 440 nm and 660 nm.

Assuming that the light emitted from the semiconductor light-emitting device 1050 has a fixed wavelength at both ends, a standing wave may be formed at an integer multiple of ½ of the wavelength. Accordingly, in the stacking of the first layer 1158a and the second layer 1158b having different doping concentrations and having different refractive indices, the second layer 1158b having a thickness of an integer multiple of ½ of the wavelength may be introduced to maximize reflection and refraction of the emitted light.

Moreover, the first layer 1158a may be stacked on the second layer 1158b to protrude laterally by a predetermined length (w). The predetermined length (w) may have a predetermined length (w) that is an integer multiple of ½ of a wavelength of light emitted from the semiconductor light-emitting device 1050 in order to maximize reflection and refraction of light emitted from the semiconductor light-emitting device 1050, similar to the thickness (t2) of the second layer described above. In this case, the predetermined length (w) may be formed within ±20% of an error range based on an integer multiple of ½ of the wavelength of light emitted from the semiconductor light-emitting device 1050 in consideration of a light emission waveform full-width at half-maximum (about 5%) and a measurement error (about 10%) of light emitted from the semiconductor light-emitting device 1050

Moreover, the reflection of light from a side surface of the semiconductor light-emitting device 1050 may be reduced by the first layer 1158a protruding by a predetermined length (w). Accordingly, a ratio of light emitted to the side surface of the semiconductor light-emitting device 1050 may be increased to improve the light extraction effect.

Meanwhile, an undoped semiconductor layer 1159 formed on the intermediate layer 1158 may be formed. Moreover, the undoped semiconductor layer 1159 may be formed to overlap with at least part of the intermediate layer 1158, and the second conductive electrode 1152 may be formed at a portion where the intermediate layer 1158 is exposed to the outermost edge. Further, a first region 1159a and a second region 1159b may be provided on a surface of the undoped semiconductor layer 1159. Specifically, the first region 1158a has a larger surface roughness than the second region 1158b, and a plurality of protrusions 1160 are disposed in the first region 1158a.

In an embodiment, the protrusion 1160 may include second conductive impurities, and the protrusion 1160 may have a higher impurity concentration than the second layer 1158b. Specifically, the impurity concentration of the protrusion 1160 may be above $10^{19}/cm^3$.

Moreover, the protrusion 1160 may be a porous structure having pores formed therein. Accordingly, even when the protrusion 1160 is formed on the outermost edge of the semiconductor light-emitting device 1050, light emitted from the semiconductor light-emitting device 1050 may not be disturbed, and the loss of the emitted light may be minimized, and a large amount of light may be emitted to the light emitting surface.

Furthermore, an upper surface of the protrusions 1160 may be formed as a flat cut surface. In addition, part of the protrusions 1160 may have a cylindrical shape. In addition, another part of the protrusions 1160 may have a conical shape.

Besides, the protrusions 1160 may include different heights. Specifically, the protrusions 1160 may have heights of less than 2 μm, and may preferably include different heights of less than 1 μm.

Furthermore, the semiconductor light-emitting device 1050 may include a passivation layer 1157 formed to cover the lateral surfaces of the first conductive semiconductor layer 1155 and the second conductive semiconductor layer 1153. For example, the passivation layer 1157 may be formed to surround the lateral surfaces and the bottom surfaces of the first conductive semiconductor layer 1155 and the second conductive semiconductor layer 1153.

Specifically, the passivation layer 1157 covers the lateral surface of the semiconductor light-emitting device to stabilize the characteristics of the semiconductor light-emitting device 1050 and is formed of an insulating material. For an example, the passivation layer 1157 may be an insulating thin film made of a silicon compound or oxide. More specifically, the passivation layer 1157 may be formed of one or more materials of AlxOy, SixOy, SixNy, SnxOy, TixOy, CrOx, and ZrOx.

As described above, the first conductive semiconductor layer 1155 and the second conductive semiconductor layer 1153 may be electrically disconnected by the passivation layer 1157 to be insulated from each other.

In this case, the passivation layer 1157 may include a plurality of passivation layers having different refractive indices so as to reflect light emitted to the lateral surfaces of the first conductive semiconductor layer 1155 and the second conductive semiconductor layer 1153. However, the present disclosure is not limited thereto, and the passivation layer 1157 may be formed as a single layer. The plurality of passivation layers may be repeatedly layered with a material having a relatively high refractive index and a material having a relatively low refractive index.

Figure 14A:
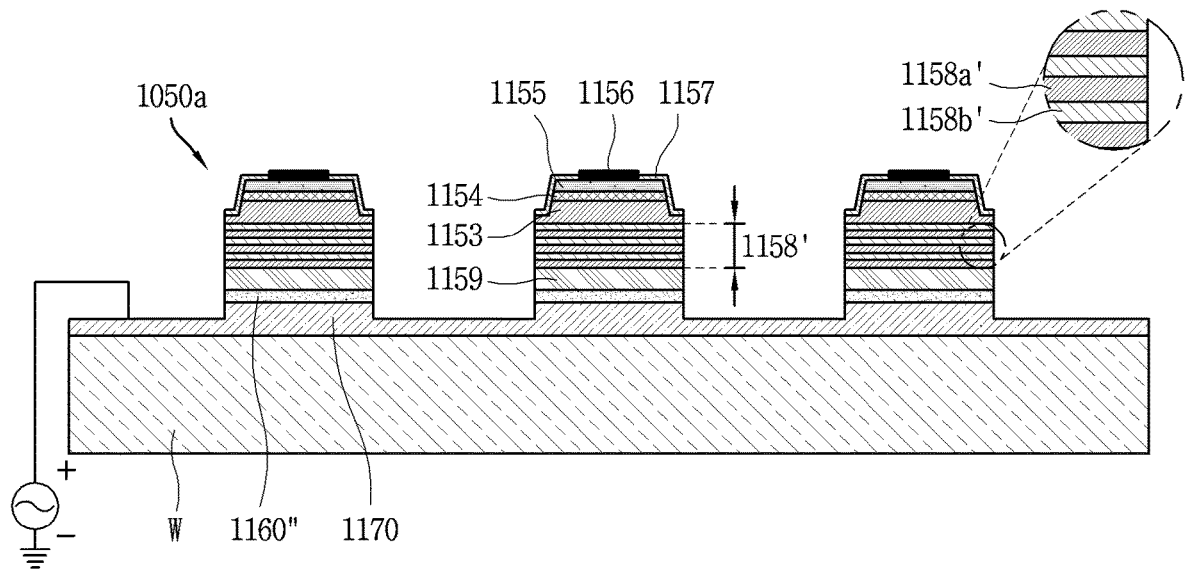
FIGS. 14A and 14B are cross-sectional views showing a method of manufacturing the vertical semiconductor light-emitting device in FIG. 11.
Figure 14B:
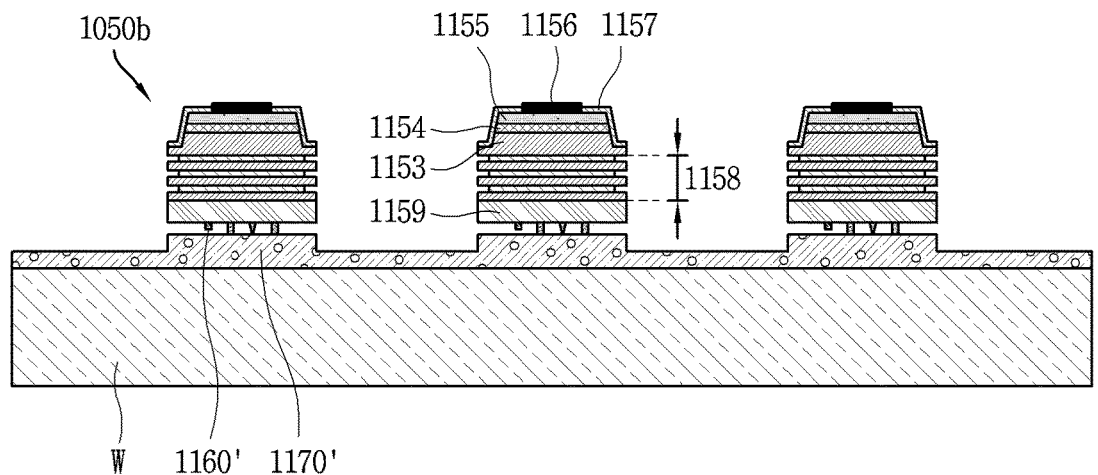

FIGS. 14A and 14B are cross-sectional views showing a method of manufacturing a display apparatus 1000 according to another embodiment of the present disclosure. According to a manufacturing method of the display apparatus 1000 which will be described below, the same or similar reference numerals are designated to the same or similar configurations to the foregoing embodiment, and the description thereof will be substituted by the earlier description.

Referring to FIG. 14A, a growth substrate (W) on which the semiconductor light-emitting device 1050a is formed may be immersed in an electrolyte solution and a current flow may be applied to perform electro polishing.

Specifically, the growth substrate (W) may be formed of a sapphire substrate or a silicon substrate. In addition, the growth substrate (W) may be formed of a plurality of layers including an undoped semiconductor layer and a doped semiconductor layer. A first sacrificial layer 1170 and a second sacrificial layer 1160" including second conductive impurities are stacked on the growth substrate (W). In this case, the second sacrificial layer 1160" has a higher concentration of second conductive impurities than the first sacrificial layer 1170.

Subsequently, the undoped semiconductor layer 1159, the intermediate layer 1158' including the first layer 1158a' and the second layer 1158b', the second conductive semiconductor layer 1153, the active layer 1154, the first conductive semiconductor layer 1155 and the first conductive electrode 1156 are sequentially stacked to form the passivation layer 1157. Subsequently, part of the first sacrificial layer 1170, the second sacrificial layer 1160", the undoped semiconductor layer 1159, the intermediate layer 1158', the second conductive semiconductor layer 1153, and the active layer 1154, the first conductive semiconductor layer 1155, and the passivation layer 1157 may be etched to form an isolated semiconductor light-emitting device 1050a.

Next, the growth substrate (W) on which the semiconductor light-emitting device 1050a is immersed in an electrolyte solution to perform electro polishing.

Referring to FIG. 14B, a semiconductor light-emitting device 1050b may be formed on the growth substrate (W) by electrolytic etching.

The first sacrificial layer 1170 and the second sacrificial layer 1160" are each electrolytically etched to form a first porous layer 1170' and a second porous layer 1160'. In particular, the second sacrificial layer 1160" having a high concentration of second conductive impurities may be etched at a faster rate than the first sacrificial layer 1170 to form the second porous layer 1160' having a higher porosity than the first porous layer 1170'.

Meanwhile, the undoped semiconductor layer 1159 may be disposed between the semiconductor light-emitting device 1050a and the second sacrificial layer 1160" to which a current is applied, thereby preventing the intermediate layer 1158' and the second conductive semiconductor layer 1153 of the semiconductor light-emitting device 1050a from being etched.

In addition, as electro polishing proceeds from an edge of the semiconductor light-emitting device 1050a to the inside, etching proceeds rapidly on an edge surface of the second porous layer 1160' to form a relatively flat second region 1159b. Meanwhile, the first region 1159a including a porous structure and surrounded by the second region 1159b is provided thereinside.

The semiconductor light-emitting device 1050b may be bonded to the foregoing substrate 1010, and separated from the growth substrate (W) to manufacture the display apparatus 1000. As the semiconductor light-emitting device 1050b is separated from the growth substrate (W), the second porous layer 1160' may be cut to form the foregoing protrusion 1160.

The second porous layer 1160' may be cut by physical energy to form protrusions 1160 having different heights. Accordingly, an upper surface of the protrusions 1160 may be formed as a flat cut surface. In addition, part of the protrusions 1160 may have a cut cylindrical shape. Moreover, another part of the protrusions 1160 may have a cut conical shape.

Besides, the protrusions 1160 may include different heights. Specifically, the protrusions 1160 may have heights of less than 2 μm, and may preferably include different heights of less than 1 μm.

Meanwhile, the second layer 1158b of the intermediate layer 1158' may be etched in an electrolyte solution to form the intermediate layer 1158. Accordingly, the first layer 1158a may protrude laterally by a predetermined length (w) than the second layer 1158b. A predetermined length (w) at which the second layer 1158b is etched may be adjusted according to the type and concentration of the electrolytic solution. In addition, an etching process for etching the second layer 1158b with a separate etching solution may be added.

As illustrated in FIGS. 14A and 14B described above, the display apparatus 1000 of the present disclosure may be manufactured by a mechanical lift-off method, thereby minimizing damage to the semiconductor light-emitting device due to heat by laser or chemicals generated when the semiconductor light-emitting device is separated by a laser lift-off method or a chemical lift-off method. In addition, since the semiconductor light-emitting device can be separated by physical energy without an additional facility, the process cost may be reduced. As a result, the manufacturing cost may be reduced.

In addition, when the display apparatus is manufactured in a manner of separating the semiconductor light-emitting device by physical energy, a thickness of the semiconductor light-emitting device may be formed to be less than 10 μm. It may be a thickness reduced by 50% or more as compared to a semiconductor light-emitting device manufactured by a laser lift-off method or a chemical lift-off method. In other words, the semiconductor light-emitting device of the display apparatus manufactured by a mechanical lift off method has an advantage of reducing the thickness. As the thickness of the semiconductor light-emitting device is reduced, loss of light emitted and emitted from an inside of the semiconductor light-emitting device may be decreased, thereby increasing the light efficiency.

Meanwhile, the semiconductor light-emitting device applied to the display apparatus described above may be modified into various forms. These modified examples will be described in the following description.

Figure 15:
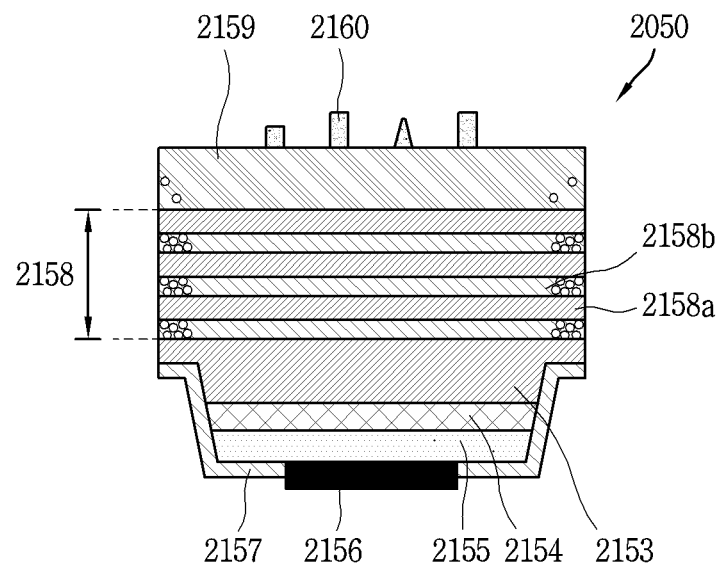
FIGS. 15 through 17 are conceptual views showing still another vertical semiconductor light-emitting device in a display apparatus having a new structure of the present disclosure.
Figure 16:
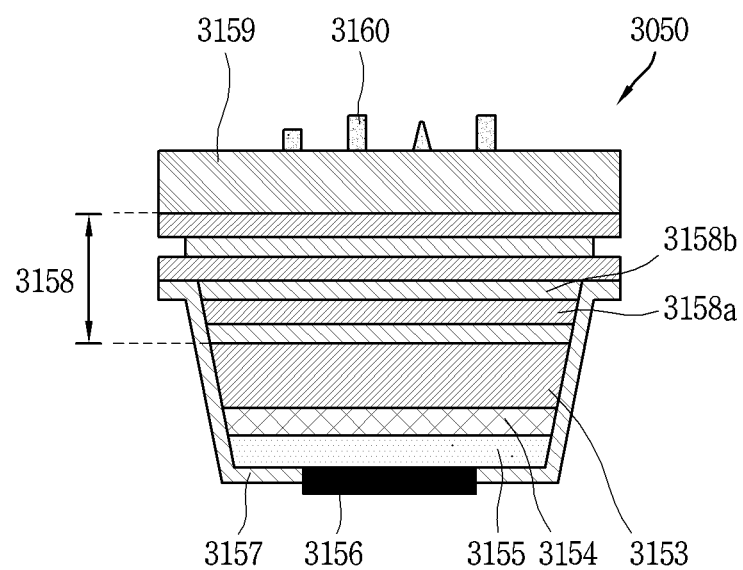
Figure 17:
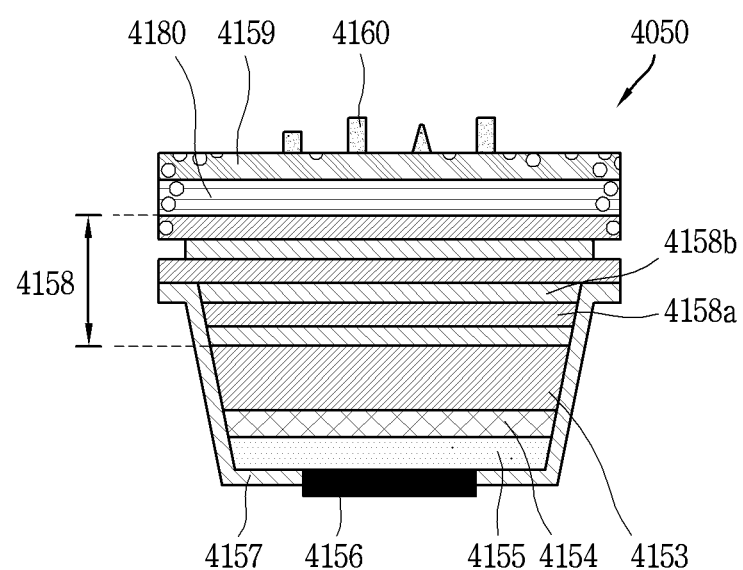

FIGS. 15 through 17 are conceptual views showing still another vertical semiconductor light-emitting device 2050, 3050, 4050 in a display apparatus having a new structure of the present disclosure.

Referring to FIG. 15, the first layer 2158a and the second layer 2158b of the intermediate layer 2158 may have different porosities. The second layer 2158b may be formed to have a larger porosity than that of the first layer 2158a. The porosity of the second layer 2158b may be adjusted by treatment with an electrolyte solution or an etching solution during the manufacturing process of the semiconductor light-emitting device 2050. Moreover, the undoped semiconductor layer 2159 may also have porosity in the treatment of an electrolyte solution or an etching solution during a manufacturing process.

In an embodiment, the second layer 2158b may have a higher porosity than that of the first layer 2158a and thus may have a high resistance. Accordingly, the intermediate layer 2158 of the semiconductor light-emitting device 2050 may be formed with a high resistance layer to reduce current leaking to a surface of the semiconductor light-emitting device 2050, thereby increasing the luminous efficiency of the semiconductor light-emitting device 2050. The second layer 2158b can have greater porosity at peripheral edges than at an interior of the second layer 2158b. The semiconductor light-emitting device 2050 can include the protrusion 2160, the passivation layer 2157, the first conductive electrode 2156, the first conductive semiconductor layer 2155, the active layer 2154, and the second conductive semiconductor layer 2153.

Referring to FIG. 16, the passivation layer 3057 may be extended to surround at least part of a side surface of the intermediate layer 3158. The semiconductor light-emitting device 3050 can include the protrusion 3160, the undoped semiconductor layer 3159. the passivation layer 3157, the first conductive electrode 3156, the first conductive semiconductor layer 3155, the active layer 3154, and the second conductive semiconductor layer 3153. The intermediate layer 3158 can include a first layer 3158a and a second layer 3158b.

Referring to FIG. 17, a third layer 4180 may be further provided between the intermediate layer 4158 and the undoped semiconductor layer 4159. The third layer 4180 may include second conductive impurities and may have a lower impurity concentration than the first layer 4158a. The impurity concentration of the third layer 4180 may range from $10^{17}/cm^3$ to $1018/cm3$. In other words, layers of the semiconductor light-emitting device 4050 including the second conductive impurities may have an impurity concentration increasing in the order of the third layer 4180, the first layer 4158a, and the second layer 4158b. The semiconductor light-emitting device 4050 can include the protrusion 4160, the passivation layer 4157, the first conductive electrode 4156, the first conductive semiconductor layer 4155, the active layer 4154. and the second conductive semiconductor layer 4153.

The semiconductor light-emitting device 4050 having the third layer 4180 may have an undoped semiconductor layer 4159 having a smaller thickness compared to the aforementioned semiconductor light-emitting device, and at this time, even considering the etching process of the undoped semiconductor layer 4159 for forming the aforementioned second conductive electrode, the second conductive electrode on the undoped semiconductor layer 4159 may form ohmic contact with the intermediate layer 4158. Specifically, a thickness of the undoped semiconductor layer 4159 of the semiconductor light-emitting device 4050 may be formed to be 200 nm or less.

Figure 18:
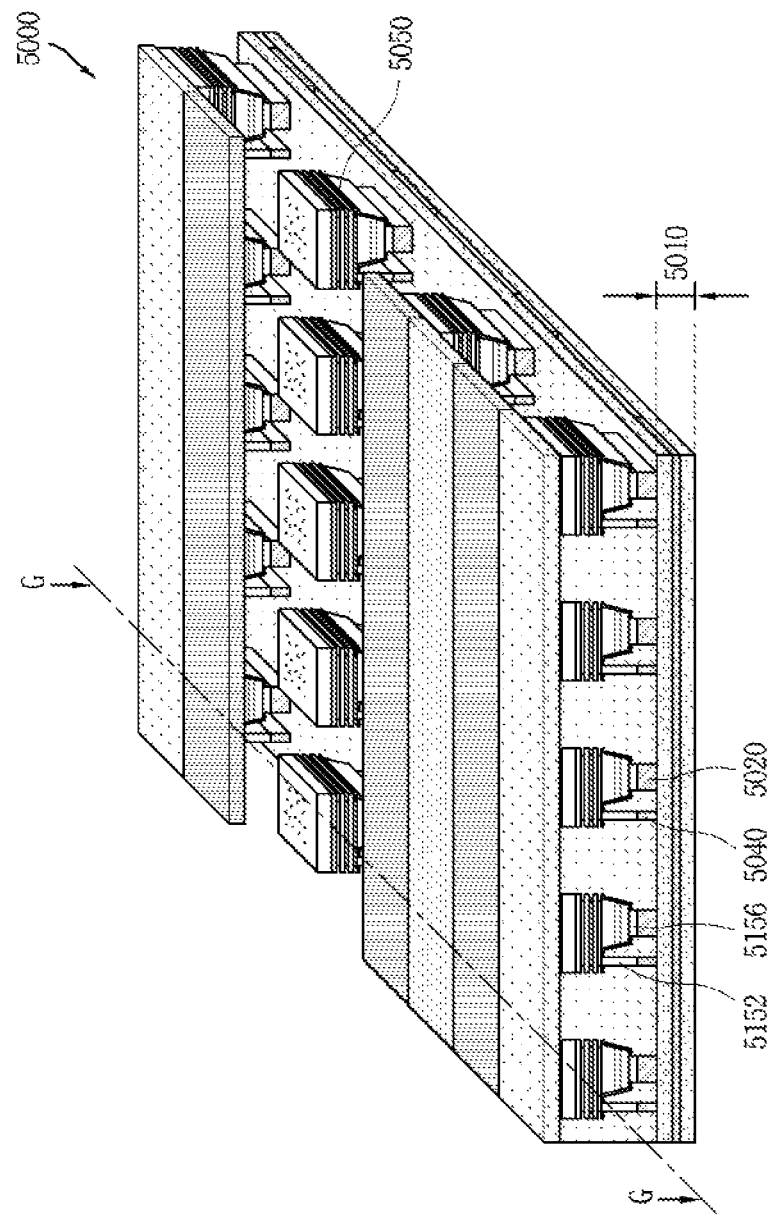
FIG. 18 is an enlarged view of portion "A" in FIG. 1 for explaining still another embodiment of the present disclosure to which a display apparatus having a new structure is applied.
Figure 19:
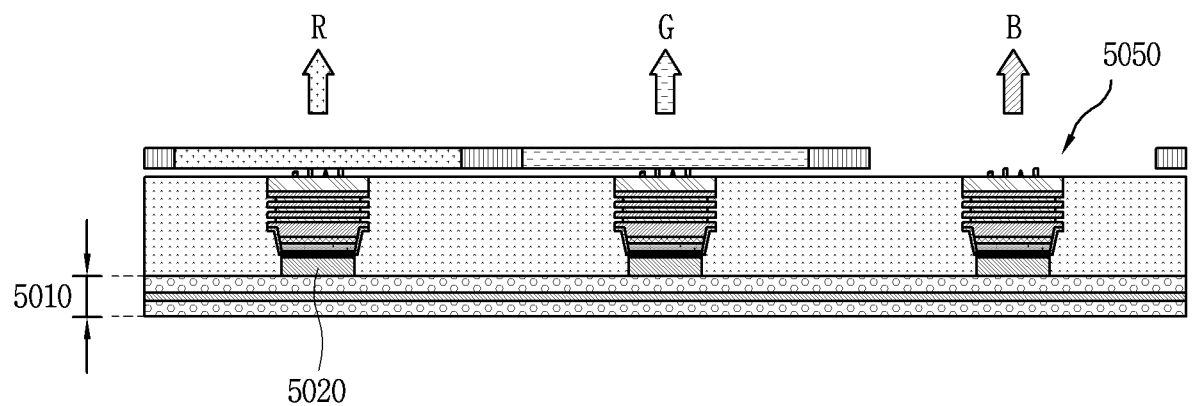
FIG. 19 is a cross-sectional view taken along line G-G in FIG. 18.

FIG. 18 is an enlarged view of portion "A" in FIG. 1 for explaining still another embodiment of the present disclosure of a display apparatus 5000 having a new structure. FIG. 19 is a cross-sectional view taken along line G-G in FIG. 18, and FIG. 20 is a conceptual view showing a flip-chip type semiconductor light-emitting device 5050 in FIG. 18.

Figure 20:
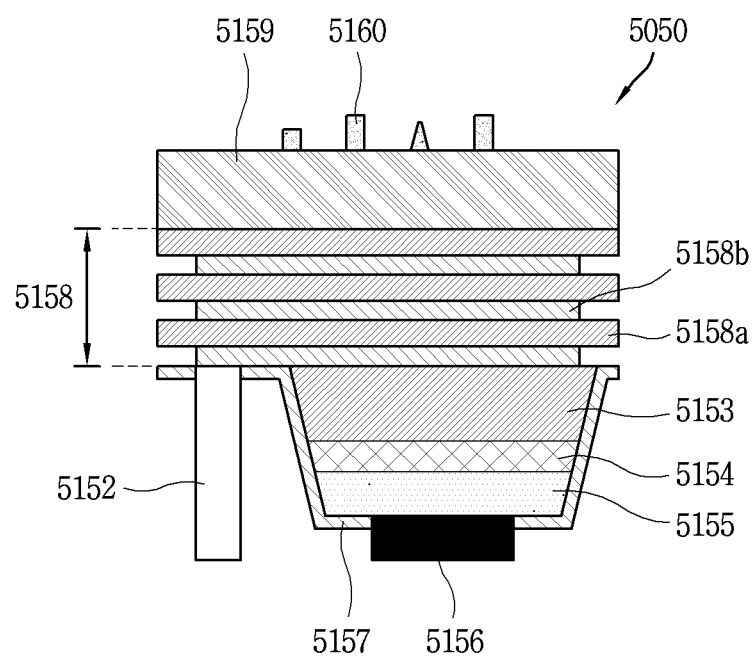
FIG. 20 is a conceptual view showing a flip-chip type semiconductor light-emitting device in FIG. 18.

Referring to FIGS. 18 through 20, the semiconductor light-emitting device 5050 of the display apparatus 5000 of the present disclosure may be formed in a flip chip type and assembled on a substrate 5010. The flip-chip type semiconductor light-emitting device 5050 may form a second conductive electrode 5152 on a second layer 5158b disposed between a second conductive semiconductor layer 5153 and a first layer 5158a. The semiconductor light-emitting device 5050 can further include the protrusion 5160, the undoped semiconductor layer 5159, the passivation layer 5157, the first conductive semiconductor layer 5155, the active layer 5154, and the intermediate layer 5158.

Accordingly, the first conductive electrode 5156 and the second conductive electrode 5152 may be electrically connected to a first electrode 5020 and a second electrode 5040, respectively, disposed on the substrate 5010.

The configurations and methods according to the above-described embodiments will not be applicable in a limited way to a display apparatus using the foregoing semiconductor light-emitting device, and all or part of each embodiment may be selectively combined and configured to make various modifications thereto.

What is claimed is:

1. A display apparatus comprising:
a plurality of semiconductor light-emitting devices,
wherein at least one semiconductor light-emitting device of the plurality of semiconductor light-emitting devices comprises:
a first conductive electrode and a second conductive electrode;
a first conductive semiconductor layer on which the first conductive electrode is disposed;
a second conductive semiconductor layer configured to overlap with the first conductive semiconductor layer, the second conductive electrode being disposed on the second conductive semiconductor layer;
an active layer disposed between the first conductive semiconductor layer and the second conductive semiconductor layer;
an intermediate layer disposed on the second conductive semiconductor layer;
a protrusion on the intermediate layer, and formed of a porous material capable of electro polishing; and
an undoped semiconductor layer disposed between the intermediate layer and the protrusion,
wherein the intermediate layer comprises:
a first layer containing second conductive impurities; and
a second layer having a higher concentration of the second conductive impurities than the first layer,
wherein the first layer and the second layer are sequentially repeated and stacked, and the first layer and the second layer have different thicknesses or different porosities, and
wherein a thickness of the second layer is within ±20% of an error range based on an integer multiple of ½ of a wavelength of light emitted from the at least one semiconductor light-emitting device.

2. The display apparatus of claim 1, wherein a porosity of the first layer is smaller than that of the second layer.

3. The display apparatus of claim 1, wherein the protrusion is formed of a conductive semiconductor, and has a higher impurity concentration than the first layer.

4. The display apparatus of claim 1, further comprising:
a third layer between the intermediate layer and the undoped semiconductor layer,
wherein the third layer contains the second conductive impurities, and has a lower impurity concentration than the first layer.

5. The display apparatus of claim 1, further comprising:
a passivation layer surrounding a side surface of the first conductive semiconductor layer, the second conductive semiconductor layer, and the active layer.

6. The display apparatus of claim 5, wherein the passivation layer is formed to extend to surround at least a part of a side surface of the intermediate layer.

7. The display apparatus of claim 1, wherein the first conductive semiconductor layer includes first conductive impurities.

8. The display apparatus of claim 7, wherein the first conductive impurities are p-type impurities, and
wherein the second conductive impurities are n-type impurities.

9. The display apparatus of claim 1, wherein peripheral edges of the second layer has greater porosity than at an interior of the second layer.

10. The display apparatus of claim 1, wherein the second layer is in contact with the second conductive semiconductor layer.

11. The display apparatus of claim 1, wherein the protrusion is provided as a plurality of protrusions, and
wherein the plurality of protrusions have different shapes and different heights.

12. The display apparatus of claim 1, wherein the undoped semiconductor layer is in contact with the first layer.

13. A display apparatus comprising:
a plurality of semiconductor light-emitting devices arranged on a substrate as sub-pixels disposed in a matrix form,
wherein each of the plurality of semiconductor light-emitting devices comprises:
a first conductive electrode;
a first conductive semiconductor layer on the first conductive electrode;
an active layer on the first conductive semiconductor layer;
a second conductive semiconductor layer on the active layer;
an intermediate layer on the second conductive semiconductor layer; and
a second conductive electrode on the intermediate layer, and
wherein the intermediate layer is formed of a plurality of alternatingly stacked layers having different thicknesses or different porosity,
wherein the plurality of alternatingly stacked layers include a plurality of first layers and a plurality of second layers, and
wherein a thickness of each of the plurality of second layers is within +20% of an error range based on an integer multiple of 1/2 of a wavelength of light emitted from a corresponding semiconductor light-emitting device among the plurality of semiconductor light-emitting devices.

14. The display apparatus of claim 13,
wherein a thickness of each of the plurality of first layers is greater than the thickness of each of the plurality of second layers, or a porosity of each of the plurality of second layers is greater than a porosity of each of the plurality of first layers.

15. The display apparatus of claim 14, wherein a length of the plurality of first layers is longer than a length of the plurality of second layers by at least a predetermined width.

16. The display apparatus of claim 13, further comprising:
an undoped semiconductor layer on the intermediate layer; and
a plurality of protrusions formed on the undoped semiconductor layer,
wherein the plurality of protrusions have different shapes or different heights.

17. The display apparatus of claim 16, wherein the undoped semiconductor layer includes a first region where the plurality of protrusions are located, and a second region that is outside the first region.

18. A display apparatus comprising:
a plurality of semiconductor light-emitting devices,
wherein at least one semiconductor light-emitting device of the plurality of semiconductor light-emitting devices comprises:
a first conductive electrode and a second conductive electrode;
a first conductive semiconductor layer on which the first conductive electrode is disposed;
a second conductive semiconductor layer configured to overlap with the first conductive semiconductor layer, the second conductive electrode being disposed on the second conductive semiconductor layer;
an active layer disposed between the first conductive semiconductor layer and the second conductive semiconductor layer;
an intermediate layer disposed on the second conductive semiconductor layer;
a protrusion on the intermediate layer, and formed of a porous material capable of electro polishing; and
an undoped semiconductor layer disposed between the intermediate layer and the protrusion,
wherein the intermediate layer comprises:
a first layer containing second conductive impurities; and
a second layer having a higher concentration of the second conductive impurities than the first layer,
wherein the first layer and the second layer are sequentially repeated and stacked, and
wherein a thickness of the second layer is within ±20% of an error range based on an integer multiple of ½ of a wavelength of light emitted from the at least one semiconductor light-emitting device.

* * * * *